US007997470B2

(12) United States Patent
Li et al.

(10) Patent No.: US 7,997,470 B2
(45) Date of Patent: Aug. 16, 2011

(54) FLANGED TRANSDUCER HAVING IMPROVED RIGIDITY

(75) Inventors: Hing Leung Marchy Li, Hong Kong (HK); Boon June Edwin Yeap, Singapore (SG); Ka Shing Kenny Kwan, Singapore (SG); Man Chan, Singapore (SG); Yam Mo Wong, Singapore (SG)

(73) Assignee: ASM Technology Singapore Pte Ltd, Singapore (SG)

( * ) Notice: Subject to any disclaimer, the term of this patent is extended or adjusted under 35 U.S.C. 154(b) by 168 days.

(21) Appl. No.: 11/563,068

(22) Filed: Nov. 24, 2006

(65) Prior Publication Data

US 2008/0121679 A1     May 29, 2008

(51) Int. Cl.
 *B23K 1/06* (2006.01)
 *B23K 20/10* (2006.01)
(52) U.S. Cl. ...................................... 228/1.1; 228/110.1
(58) Field of Classification Search ................ 228/110.1, 228/1.1
See application file for complete search history.

(56) References Cited

U.S. PATENT DOCUMENTS

| 6,135,339 | A | 10/2000 | Parrini ............................ 228/1.1 |
| 6,766,936 | B2 | 7/2004 | Kyomasu et al. ................ 228/1.1 |
| 7,303,110 | B2 * | 12/2007 | Zhai et al. ........................ 228/1.1 |
| 2005/0284912 | A1 * | 12/2005 | Zhai et al. ........................ 228/1.1 |

* cited by examiner

*Primary Examiner* — Emily M Le
*Assistant Examiner* — Megha Mehta
(74) *Attorney, Agent, or Firm* — Ostrolenk Faber LLP

(57) ABSTRACT

A transducer is provided that comprises a horn that is configured to transmit vibrations along its length during operation in the form of an oscillatory waveform, such oscillatory waveform having a plurality of vibration nodal points. An ultrasonic generator is coupled to one end of the horn and a bonding tool is coupled to an opposite end of the horn for performing bonding operations. A first flange structure is located along the length of the horn at a first vibration nodal point for mounting the transducer, and a second flange structure is located along the length of the horn at a second vibration nodal point for mounting the transducer, such that the second flange structure is separated from the first flange structure by a distance of at least two consecutive vibration nodal points.

5 Claims, 2 Drawing Sheets

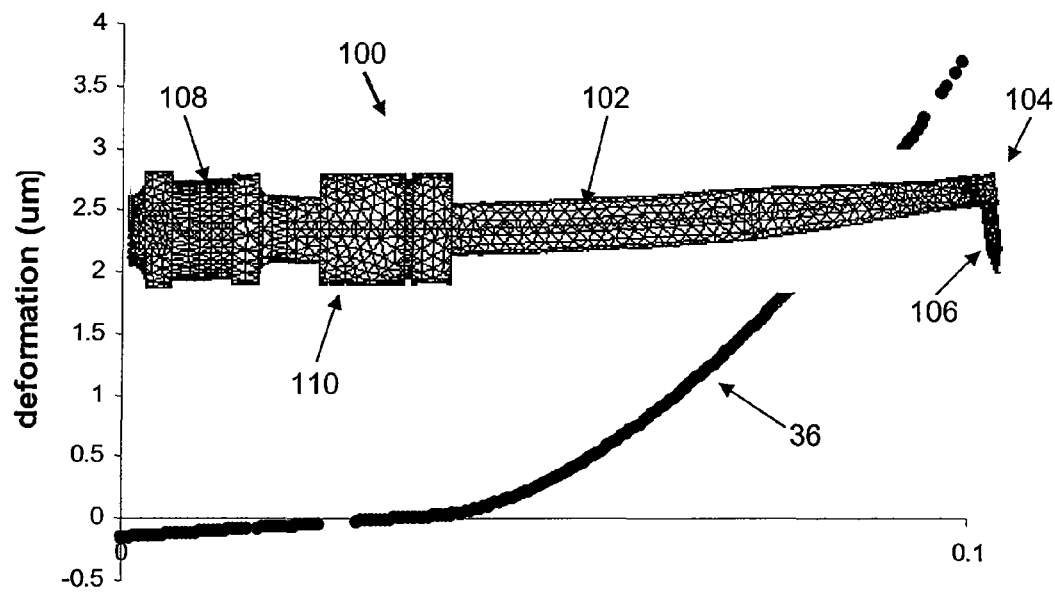
FIG. 3  - PRIOR ART -
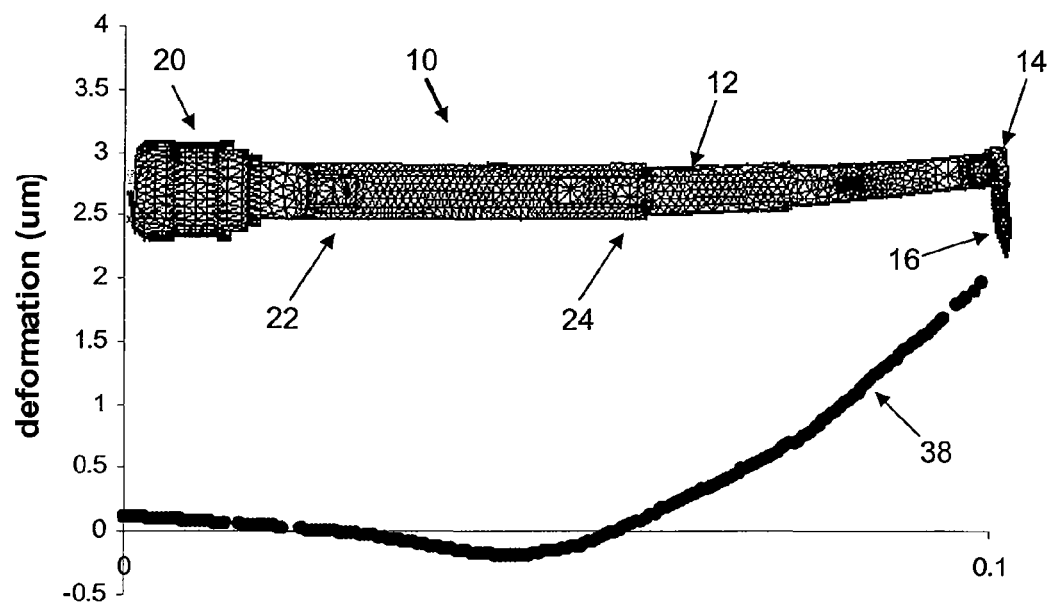
FIG. 4

FLANGED TRANSDUCER HAVING IMPROVED RIGIDITY

FIELD OF THE INVENTION

The invention relates to a transducer for generating bonding energy to a surface of interest, such as a bond pad of an electronic device during ultrasonic wire bonding.

BACKGROUND AND PRIOR ART

During the production of electronic devices, there is sometimes a need to mount an integrated circuit die or chip onto a carrier. After mounting, electrical connections are made between the chip and the carrier, typically by the use of bonding wires. The product is then molded into a semiconductor package. These bonding wires may be attached to bond pads on the chip and the carrier respectively by ultrasonic welding using a transducer that is caused to vibrate at ultrasonic frequencies.

A conventional transducer comprises a piezoelectric element for generating ultrasonic vibrations, an ultrasonic amplifying horn and a bonding tool which is normally in the form of a capillary or wedge. The bonding tool is located at the free end of the amplifying horn and is used to apply the bonding force to the components being welded together.

The amplifying horn is usually provided with a flange or other form of mounting member, often known as a barrel or collar, that permits the transducer to be mounted to a bond head of a wire bonding machine for movement in the X, Y and Z axes (and also in some designs about a rotational or theta axis) as required in a sequence of bonding operations.

When the ultrasonic transducer is integrated into a wire-bonding machine, since very fine wires and bond pitches are involved, the manner in which the ultrasonic transducer is mounted to the wire-bonding machine is very important. For example, if the ultrasonic transducer is mounted such that vibrations from the transducer are transferred to a mounting bracket, ultrasonic energy loss can result. If there is excessive vibration, the transducer characteristics, such as its frequency spectrum characteristics, may be changed, thereby affecting the stability of the transducer. Furthermore, the impedance of the transducer may change unpredictably, making it harder to control. Therefore, it is important to mount the ultrasonic transducer such that vibration generated during ultrasonic bonding is isolated to the transducer itself, and as far as possible, these vibrations are not transmitted to the rest of the wire-bonding machine.

One way of mounting the transducer to the bonding machine is by the introduction of a flange. Another way could be to clamp the transducer to the bonding machine.

In the case of a flange-mounted ultrasonic transducer, one way in which vibration to the wire-bonding machine can be minimized is disclosed in U.S. Pat. No. 6,135,339 for "Ultrasonic Transducer with a Flange for Mounting on an Ultrasonic Welding Device, in particular on a Wire Bonder". This patent teaches locating the flanges on a nodal point of the longitudinal vibration of the horn, and also forming the flange with a sufficient length such as to introduce a nodal point for radial vibration of the horn so as to locate a mounting point at the said radial nodal point. The ultrasonic transducer is mounted at the positions of these radial nodal points so that vibrations at the mounting positions are the lowest possible, and thereby reducing the transmission of vibration to the wire-bonding machine to which the transducer is mounted. There is only one pair of flanges located at the same vibrational nodal position of the horn.

Another example of a flange-mounted transducer is disclosed in U.S. Pat. No. 6,766,936 entitled "Transducer and Bonding Apparatus Using the Same". It describes two pairs of flange supports located on both sides of an amplifying horn, comprising holding portions that protrude from at least two locations that correspond to the nodes of vibration of the transducer main body, and connecting portions that connect the tip ends of the protruding holding portions to each other.

In the aforesaid patent, the holding portions are located at adjacent nodes of vibration of the transducer main body, which is equivalent to half a wavelength of an oscillatory waveform. However, a distance of the front-side holding portion to a tip of the transducer is more than one wavelength away. The problem is that the suspended part of the amplifying horn from the front-side holding portion and the tip of the transducer is quite long, resulting in less rigidity in the suspended portion. Hence, the rigidity of this part of the horn must be increased by the use of harder materials or increasing the cross-section of the horn. Otherwise, the suspended part of the transducer will incur significant deflection during bonding when a load is experienced at the tip of the transducer.

SUMMARY OF THE INVENTION

It is thus an object of the invention to seek to provide a transducer that has increased rigidity to decrease deflection of a tip of the transducer during bonding to avoid some of the aforesaid disadvantages of prior art transducers.

Accordingly, the invention provides a transducer comprising: a horn configured to transmit vibrations along its length during operation in the form of an oscillatory waveform which comprises a plurality of vibration nodal points; an ultrasonic generator coupled to one end of the horn and a bonding tool coupled to an opposite end of the horn for performing bonding operations; a first flange structure located along the length of the horn at a first vibration nodal point for mounting the transducer; a second flange structure located along the length of the horn at a second vibration nodal point for mounting the transducer, the second flange structure being separated from the first flange structure by a distance of at least two consecutive vibration nodal points.

It will be convenient to hereinafter describe the invention in greater detail by reference to the accompanying drawings, which illustrate one embodiment of the invention. The particularity of the drawings and the related description is not to be understood as superseding the generality of the broad identification of the invention as defined by the claims.

BRIEF DESCRIPTION OF THE DRAWINGS

An example of a preferred embodiment of a flanged transducer in accordance with the invention will now be described with reference to the accompanying drawings, in which:

FIG. 3 is a side view of a conventional transducer showing its vertical displacement when subjected to a static load; and FIG. 4 is a side view of the flanged transducer according to the preferred embodiment of the invention showing its vertical displacement when subjected to the same static load as that applied to the conventional transducer illustrated in FIG. 3.

DETAILED DESCRIPTION OF THE PREFERRED EMBODIMENT OF THE INVENTION

Figure 1:
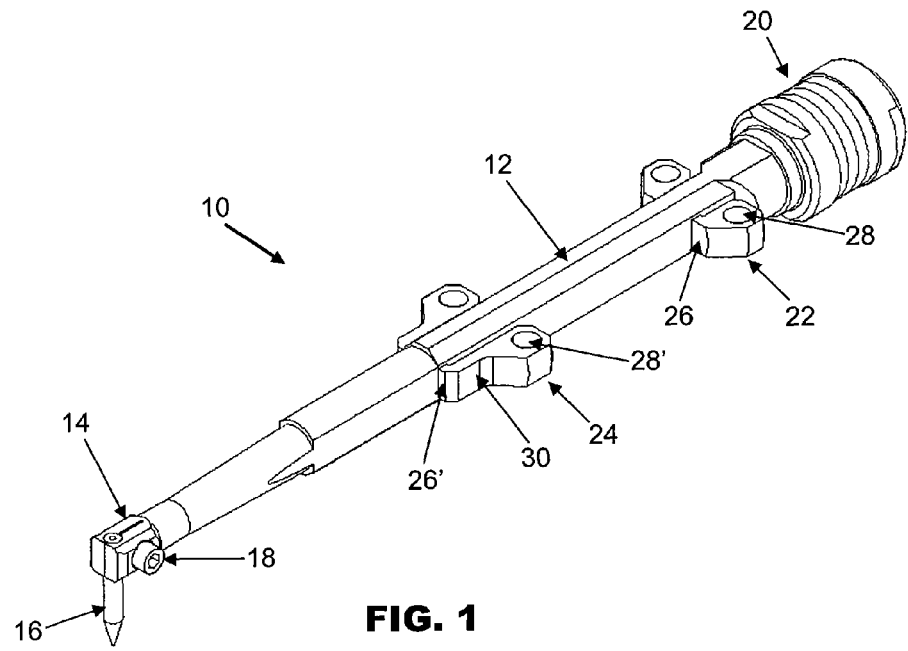
FIG. 1 is an isometric view of a flanged transducer according to the preferred embodiment of the invention.

FIG. 1 is an isometric view of a flanged transducer 10 according to the preferred embodiment of the invention. The transducer 10 has an elongated main body generally comprising a horn 12. The horn 12 has a tip end 14 at which a bonding tool such as a capillary 16 may be attached to the horn 12 by a screw 18 for performing bonding operations. An ultrasonic generator 20 comprising a number of piezoelectric elements is mounted to the horn 12 at an opposite end of the horn 12. The ultrasonic generator 20 is typically bolted onto the end of the horn 12. In operation, the horn 12 is configured to transmit vibrations generated from the ultrasonic generator 20 along its length towards the capillary 16 for bonding. The vibrations are typically transmitted in the form of an oscillatory waveform.

The transducer 10 is mounted onto a bond head (not shown) at the positions of a first flange structure 22 and a second flange structure 24 located along the length of the horn 12. Each flange structure 22, 24 has a neck portion 26, 26' protruding from the horn 12 at which the flange structure is connected to the horn 12. A mounting portion of the flange structure may include a mounting device such as a screw hole. Thus, screw holes 28, 28' may be formed on the flange structures 22, 24 for receiving screws to mount the transducer 10 onto the bond head. In the illustrated embodiment, the second flange structure 24 also has an elongate shoulder section 30 between the mounting portion containing the screw hole 28' and the neck portion 26' that extends substantially parallel to a longitudinal axis of the horn 12 to link the screw hole 28' with the neck portion 26'. The shoulder section 30 is useful to allow the screw hole 28' to be located at a corresponding mounting position on the bond head if the neck portion 26' (located at a vibrational nodal position on the horn 12) is not coincident with a mounting position on the bond head.

Figure 2:
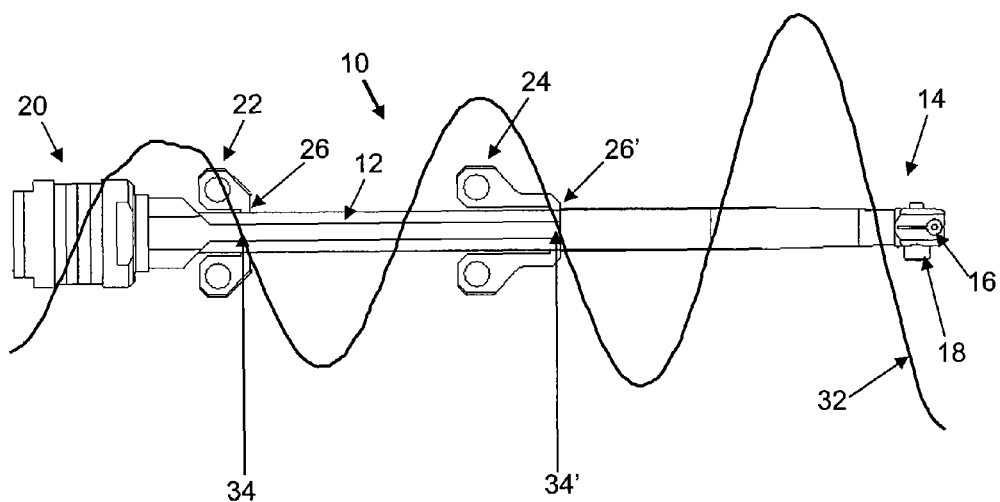
FIG. 2 is a plan view of the flanged transducer showing a varying vibration amplitude profile along the length of the transducer.

FIG. 2 is a plan view of the flanged transducer 10 showing a varying vibration amplitude profile along the length of the transducer 10 when the transducer 10 is in use. A waveform 32 that is produced by the ultrasonic generator 20 has a plurality of vibration nodal points (such as 34, 34') whereat the amplitude of vibration is minimal. A maximum amplitude of vibration should be generated at the tip end 14 of the transducer 10 at the position of the capillary 16 where wire bonding is to be performed.

The first flange structure 22 has a neck portion 26 that is located along the length of the horn 12 at one vibration nodal point 34 and the second flange structure 24 has a neck portion 26' that is located at another vibration nodal point 34'. Locating the flange structures 22, 24 at the nodal points 34, 34' prevents ultrasonic energy from being dissipated to the bond head.

In the preferred embodiment of the invention, the second flange structure 24 is separated from the first flange structure 22 by a distance of at least two consecutive nodal points along the horn 12 of the transducer 10, as shown in FIG. 2. In other words, there is at least one unused vibration nodal point in between the first and second flange structures 22, 24. More preferably, the two nodal points at which the flange structures 22, 24 are mounted are separated by one wavelength.

In prior art transducers, where there are two mounting points along the horn of the transducer, the mounting points are located adjacent to each other on consecutive nodal points, such as in U.S. Pat. No. 6,766,936 mentioned above (see FIG. 1 thereof). By separating the first and second flange structures 22, 24 by a distance of two or more consecutive nodal points, or more preferably by one wavelength, rigidity of the transducer 10 can be improved as the mounting support is located closer to the tip end 14. This enables deflection at the tip end 14 of the transducer 10 to be reduced.

FIG. 3 is a side view of a conventional transducer 100 showing its vertical displacement when subjected to a static load. In this example, the static load is exerted downwards and it is equal to 0.5 kgf. The conventional transducer 100 has a horn 102, a tip end 104 for attaching a capillary 106 for bonding, and an ultrasonic generator 108 mounted at an opposite end of the horn 102. The conventional transducer 100 is mounted only at the position of a mounting barrel 110, where the mounting barrel 110 is clamped onto the bond head. The transducer 100 is clamped at the position of a vibrational nodal point that is located on the mounting barrel 110.

FIG. 4 is a side view of the flanged transducer according to the preferred embodiment of the invention showing its vertical displacement when subjected to the same static load of 0.5 kgf as that applied to the conventional transducer illustrated in FIG. 3.

The graph 36 showing vertical displacement of the conventional transducer 100 demonstrates that the horn 102 of the conventional transducer 100 faces deflection along its length primarily between the mounting barrel 110 (where the transducer 100 is clamped) and the capillary 106. On the other hand, the graph 38 showing vertical displacement of the horn 12 of the flanged transducer 10 according to the preferred embodiment of the invention demonstrates that the horn 12 faces deflection along its length primarily between the second flanged structure 24 and the capillary 16. The length of the horn 12 of the flanged transducer 10 that is deflected is much shorter than that of the horn 102 of the conventional transducer 100. As a result, the amount of deflection experienced by the flanged transducer 10 is about 2.0 µm, which is significantly less than the deflection experienced by the conventional transducer 100, which is deflected by about 3.7 µm. Hence, the flanged transducer 10 is more rigid in the direction of application of a downward force applied during bonding.

It is apparent that the conventional transducer is mounted at a position on the mounting barrel 110 that is further away from its tip end 104 than the second flange structure 24 is from its tip end 14. This improves the rigidity of the flanged transducer 10 as the length of the horn 12 that is susceptible to deflection is shortened. Thus, when the capillary 16 is pressed onto a bonding surface, the deflection encountered by the flanged transducer 10 is less than that encountered by the conventional transducer 100.

It should be appreciated that the flanged transducer 10 according to the preferred embodiment of the invention may be made more rigid without having to increase the cross-sectional area of the horn 12. Thus, it is capable of minimizing the inertia of the transducer while enhancing rigidity in the direction of a static load applied during bonding.

The invention described herein is susceptible to variations, modifications and/or additions other than those specifically described and it is to be understood that the invention includes all such variations, modifications and/or additions which fall within the spirit and scope of the above description.

The invention claimed is:

1. A transducer comprising:
    a horn configured to transmit vibrations along a length thereof during operation of the transducer in a form of an oscillatory waveform comprising a plurality of vibration nodal points, the horn having a first end and an end opposite the first end;
    an ultrasonic generator coupled to the first end of the horn;
    a bonding tool coupled to the end of the horn opposite the first end and configured to perform a bonding operation;

a first flange structure positioned along a length of the horn at a first vibration nodal point of the plurality of vibration nodal points and configured for mounting the transducer; and a second flange structure positioned along the length of the horn at a second vibration nodal point of the plurality of vibration nodal points and configured for mounting the transducer, the second flange structure being separated from the first flange structure by a distance of exactly one wavelength of the oscillatory waveform.

2. The transducer as claimed in claim 1, wherein each of the first flange structure and the second flange structure comprises a neck portion protruding from the horn at the vibration nodal point and the second vibration nodal point, respectively, and a mounting portion positioned distally from the neck portion at a terminus of the flange structure and free of direct contact with the horn, the mounting portion connected to the neck portion, the mounting portion including a hole configured to attach the transducer to a bonding machine.

3. The transducer as claimed in claim 2, wherein the first flange structure or the second flange structure further comprises an elongate shoulder portion positioned between the mounting portion and the neck portion and extending substantially parallel to a longitudinal axis of the horn.

4. The transducer as claimed in claim 1, wherein the bonding tool comprises a capillary.

5. The transducer as claimed in claim 1, wherein the first flange structure is unconnected to the second flange structure except only via the horn.

* * * * *